United States Patent [19]

Kovac et al.

[11] Patent Number: 5,047,834
[45] Date of Patent: Sep. 10, 1991

[54] HIGH STRENGTH LOW STRESS ENCAPSULATION OF INTERCONNECTED SEMICONDUCTOR DEVICES

[75] Inventors: Caroline A. Kovac, Ridgefield, Conn.; Ismail C. Noyan, Peekskill, N.Y.

[73] Assignee: International Business Machines Corporation, Armonk, N.Y.

[21] Appl. No.: 574,393

[22] Filed: Aug. 27, 1990

Related U.S. Application Data

[63] Continuation of Ser. No. 368,740, Jun. 20, 1989, abandoned.

[51] Int. Cl.[5] .................. H01L 23/28; H01L 23/48
[52] U.S. Cl. .................................. 357/72; 357/69
[58] Field of Search .............. 357/65, 68, 69, 70, 357/72, 73, 29, 54; 437/217, 220, 224, 211

[56] References Cited

U.S. PATENT DOCUMENTS

| | | | |
|---|---|---|---|
| 3,742,599 | 7/1973 | Desmond et al. | 357/72 |
| 3,764,862 | 10/1973 | Jankowski et al. | 357/72 |
| 3,839,660 | 10/1974 | Stryker | 357/67 |
| 3,909,838 | 9/1975 | Beyerlein | 357/70 |
| 4,001,863 | 1/1977 | Kobayashi et al. | 357/72 |
| 4,026,008 | 5/1977 | Dress et al. | 29/574 |
| 4,250,347 | 2/1981 | Fierkens | 174/52 PE |
| 4,296,424 | 10/1981 | Shibasaki et al. | 357/1 |
| 4,604,644 | 8/1986 | Beckham et al. | 357/80 |
| 4,658,332 | 4/1987 | Baker et al. | 361/398 |
| 4,788,583 | 11/1988 | Kawahara et al. | 357/72 |
| 4,839,713 | 6/1989 | Teraoka et al. | 35/70 |

FOREIGN PATENT DOCUMENTS

| | | | |
|---|---|---|---|
| 2851951 | 6/1979 | Fed. Rep. of Germany | 357/72 |
| 54-133073 | 10/1979 | Japan | |
| 57-133653 | 8/1982 | Japan | 357/72 |
| 58-21850 | 2/1983 | Japan | 357/72 |
| 60-94746 | 5/1985 | Japan | 357/72 |
| 62-24650 | 2/1987 | Japan | 357/72 |
| 63-240053 | 10/1988 | Japan | 357/72 |
| 1-61660 | 3/1989 | Japan | |

OTHER PUBLICATIONS

The Microelectronics Packaging Handbook, edited by R. R. Tummala and E. J. Rymaszewski, published by Van Nostrand (1989) pp. 409–431 "Tape Automated Bonding".
The Microelectronics Packaging Handbook, edited by R. R. Tummala and E. J. Rymaszewski, published by Van Nostrand (1989) Chapter 6 pp. 391–408 "Wirebonding".
The Microelectronics Packaging Handbook, edited by R. R. Tummala and E. J. Rymaszewski, published by Van Nostrand (1989) Chapter 8 pp. 589–611 "Wire Sweep".

Primary Examiner—Andrew J. James
Assistant Examiner—D. Monin
Attorney, Agent, or Firm—Daniel P. Morris; Alvin J. Riddles

[57] ABSTRACT

A semiconductor packaging technique employing a high Young's modulus, localized, external connection to pad, bond immobilizing member, together with, as needed, a low Young's modulus environmental protection covering member. A chip of Si or GaAs has an annulus of high Young's modulus epoxy over the line of external connections such as beam leads or wire bonds near the edge and a coating of silicone over the entire chip surface including the annulus.

5 Claims, 2 Drawing Sheets

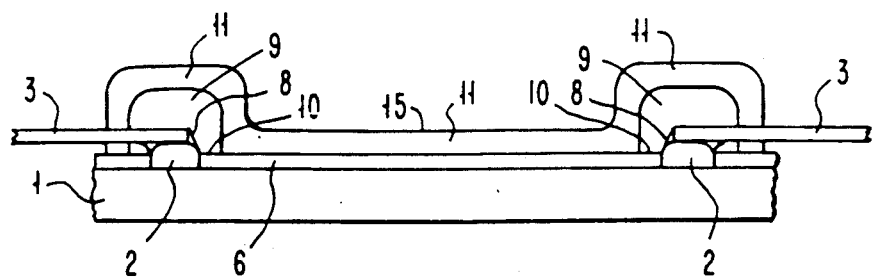
FIG. 1
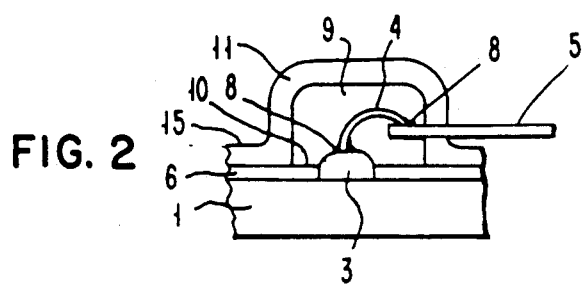
FIG. 2
FIG. 3
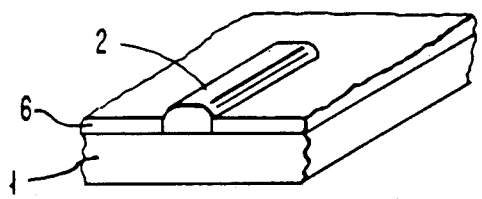
FIG. 4
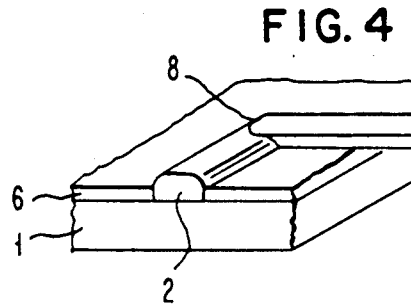
FIG. 5
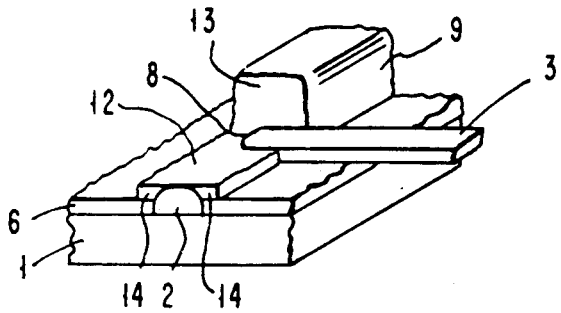
FIG. 6
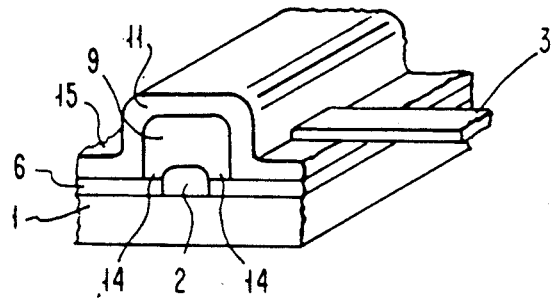

HIGH STRENGTH LOW STRESS ENCAPSULATION OF INTERCONNECTED SEMICONDUCTOR DEVICES

This application is a continuation of application Ser. No. 07/368,740 filed 06/20/89 now abandoned.

DESCRIPTION

1. Field of the Invention

The invention is in the field of packaging semiconductor devices employing circuit connections from the semiconductor device to external circuitry.

2. Background of the Invention and Relation to the Prior Art

The semiconductor device art is moving in the direction of including progressively greater circuit density in the semiconductor integrated circuit chips and this in turn results in a large quantity of very small contacting locations that require interconnection to outside or external circuitry. The sizes involved and volume of production are such that normal manual dexterity can no longer be employed. The structure, the materials, the process and the processing conditions must then be compatible both for the fabrication and for the life of the device.

The interconnection between the contact area on the chip and the external circuitry is made using a member, extending from an adjacent conductor on a supporting member, that is bonded to the contact area. The connecting members are generally the cantilevered ends, extending into a chip accommodating opening, of an array of leads that are closely spaced around that opening for the semiconductor chip and which array expands outwardly into a more easily connectable spacing. This type of conductor array has become known in the art as a lead frame.

As the art has continued to progress, a variation of the lead frame technology has evolved in which a conductor pattern is placed on a tape type filament. Such a structure facilitates automated registration. This technology has become known as Tape Automated Bonding (TAB). In the TAB technology, the conductor lead ends extend as beam leads cantilevered into an opening for the semiconductor chip in the tape filament. The TAB technology is described in the "Microelectronics Packaging Handbook" edited by R. R. Tummala and E. J. Rymaszewski, published by Van Nostrand, (1989) pages 409-431.

Another connection technology is known in the art as wire bonding, wherein segments are bonded to the contact or pad on the chip at one end and to the external conductor, which may be part of a lead frame, at the other end. The wire bonding technology is also described in the "Microelectronics Packaging Handbook" edited by R. R. Tummala and E. J. Rymaszewski, published by Van Nostrand, (1989) Chapter 6, pages 391 to 408; with a further section in Chapter 8 thereof, pages 589 to 611, directed to limitations in the wire bond technology due to a condition occurring during injection molding called "wire sweep" in which a wave of encapsulant may break the wires as it fills a cavity containing the semiconductor device.

As specifications have become more rigorous, it is becoming increasingly difficult to find encapsulation materials for the combined purposes of providing strengthening and environmental protection that will be compatible with the overall processing and life conditions.

In the art, one technique employed has been to use a first encapsulating material around the entire chip and the bonded leads that had one property and thereover a second encapsulating material that had a different property. The encapsulation was performed by injection molding from both sides. Examples of this technique are shown in U.S. Pat. Nos. 4,788,583 and 4,026,008 wherein there is an inner, all encompassing encapsulant, that immobilizes the bonded leads and the chip, and thereover an outer generally moisture resistant encapsulant encompassing the entire structure and facilitating external lead positioning and connecting.

At the present state of the art, the processing is such that encompassing the entire structure with encapsulant is not always viable. Materials that are satisfactory for external connection immobilization are generally not satisfactory to be used over an entire chip area when subjected to the wide temperature range conditions of processing and service.

SUMMARY OF THE INVENTION

The invention employs a material for semiconductor chip external connection immobilization having properties suited to that purpose but only in a restricted area of coverage together with, as needed, an environmental protection material. The immobilization material has the property of a high Young's modulus, and, consistent with restricted localized area application, should have a low temperature coefficient of expansion. The environmental protection material has the property of a low Young's modulus. Mechanical protection for the chip and interconnections is thus provided with minimized residual stresses due to encapsulation.

BRIEF DESCRIPTION OF THE DRAWINGS

FIG. 1 is a schematic cross sectional view of the immobilization and environmental protection encapsulation of the invention as applied to a beam lead structure.

FIG. 2 is a schematic cross sectional view of the immobilization and environmental protection encapsulation of the invention as applied to a "wire bond" type structure.

FIGS. 3-6 are three dimensional schematic views of a beam lead interconnection and the application of encapsulation thereto.

DESCRIPTION OF THE INVENTION

Figure 7:
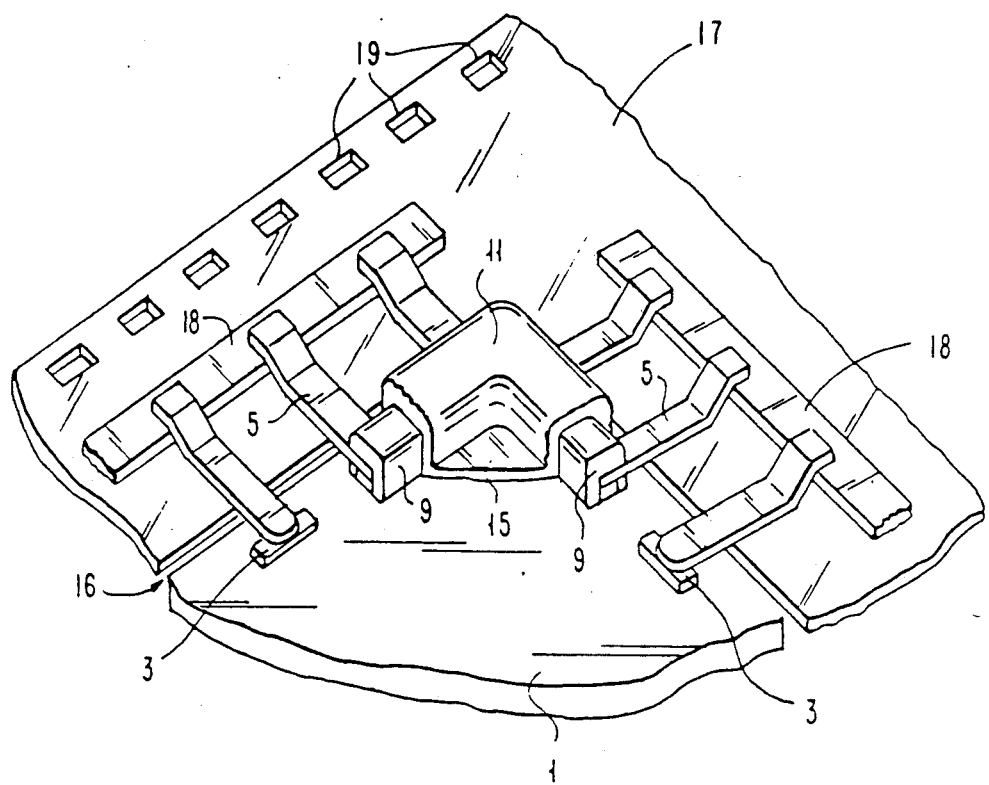
FIG. 7 is a three dimensional view of a section of a Tape Automated Bond chip assembly with cutaway immobilization and environmental protection encapsulation.

In the fabrication of semiconductor integrated circuits supporting material is needed to immobilize and to prevent stress damage where the external connection is bonded to the pad on the chip. The materials generally available for encapsulation are incompatible with the chip expansion or with processing conditions. In the processing, the chip assembly in most cases is accessible for connection and fabrication only from one side.

The invention involves the providing of external connection immobilization material in a localized area and thereover the providing of an environmental protection material as needed.

In FIGS. 1 and 2 there is shown a schematic cross sectional view of the external connection immobilization and environmental protection encapsulation of the invention as applied in FIG. 1 to a beam lead type structure and in FIG. 2 to a wire bond type structure. In FIG. 1 an integrated circuit chip 1 is provided with example contact pads 2 at opposite edges to which beam leads 3 are bonded. The bond between the beam lead 3 and the pad 2 is subject to vibrational stresses and shear stress due to different expansion performance of the parts in the package assembly. In FIG. 2, a connecting element 4 of wire is bonded both to the pad 3 and to an external conductor 5. The "wire bond" type structure 4 is subject to vibrational stresses and side "wire sweep" stresses that occur in injection molding.

In both Figures the chip 1 generally will have a passivated surface shown schematically as a single layer 6 through which the connecting pads 2 extend. The passivation protects the circuitry of the integrated circuit from environmental effects. The pads 2 are generally of a good conductor material such as copper, aluminum or solder, and frequently extend above the surface of the passivation 6 as bumps. The beam leads 3 or wires 4 are fused to the pads 2 at bonds 8.

In accordance with the invention, the effect of stress at the bond 8 is prevented by providing localized immobilizing material 9 at the location of the bonds 8 and in an area 10 of contact with the chip surface that is restricted to the vicinity of the pad 2 and extending vertically high enough to surround and cover the beam lead bond 8 or wire bonds 8 where contact is made to the pad 2.

The immobilizing material 9 has a high Young's modulus thereby imparting reinforcement and immobilization, and, since the area of contact 10 is restricted to only the vicinity of the pads 2, the material 9 should have a low temperature coefficient of expansion (TCE) property. In general, materials usable as the material 9, such as the "filled" epoxy plastic materials that have a high Young's modulus, have a substantial mismatch with the temperature/expansion performance of semiconductors and hence produce stresses when used over a broad semiconductor surface 15, such as the area between the pads 2 in FIG. 1 or beyond the material 9 in FIG. 2.

In most applications, an environmental protection material 11 is provided over the entire surface including the localized immobilizing material 9. The material 11 protects from such environmental effects as water vapor and physical contact with objects such as could occur during shelf life. The material 11 has a low Young's modulus. In applications, such as one where an hermetically sealed container is employed, the function of the environmental protection material 11 would be performed in a different way by the container.

For purposes of definition, Young's modulus which is also known as the modulus of elasticity is a constant that expresses the ratio of unit stress to unit deformation for all values to the proportional limit of the material. The greater the Young's modulus the less deformation will occur for any unit stress.

Some materials including plastics which are brittle or are very hard, have their performance constants in terms of fiber stresses or flexural strength. This modulus is related to Young's modulus and is known as the flexural modulus. These moduli are well tabulated in the handbooks used in the art. For purposes of clarity in explanation, all performance moduli will be referred to as Young's modulus.

The temperature coefficient of expansion (TCE) is the increase in each direction in length per unit length per unit rise in temperature.

As examples for perspective, the TCE of Silicon semiconductor material is 2.3 (parts per million per degree C), the TCE of filled Epoxy plastic is about 20 and the TCE of Silicone is about 200. The Young's modulus of Silicone is very low.

The overall stress at a chip connection 2 is the mathematical product, of a quantity that relates the expansion performance of the semiconductor material 1 and the filled polymer 9, and Young's modulus. The relationship is expressed in Equation 1.

$$\text{Stress} = (\Delta\alpha \, \Delta\tau) \cdot \text{Young's modulus} \qquad \text{Eq. 1}$$

where $\Delta\alpha$ is the TCE of the chip minus the TCE of the filled polymer.

It will be apparent to one skilled in the art that stress can be controlled by either lowering the TCE mismatch or the Young's modulus.

While it will be apparent to one skilled in the art in the light of the principles set forth of material property compensation by localized support and broad area encapsulation that the invention may be applied to many connection structures, for simplicity of explanation the description will be focused on the beam lead type of structure.

In accordance with the invention, it has been found that an important stress component is propagated parallel to the chip surface along beam leads 3 produces shear stress at the bond 8. The shear stress is considered as resulting from differential expansion between the chip, the tape or other support and the leads.

In FIGS. 3 to 6, the beam lead interconnection technology of the invention is shown in greater detail using the same reference numerals. For perspective on scale the width of the beam leads and the spacing between them is approaching 1 micrometer in the art.

Referring to FIG. 3, a schematic illustration of the pad on the chip is provided. On a portion of the chip 1 with passivation 6, a pad 2 extends from the circuitry in the chip, not shown. Since the pad 2 serves as an electrical connection, it has the properties of high electrical conductivity and bondability with the beam leads to be used. In the art, a bump either on the pad or the beam lead is used for registration and to provide bonding material. For purposes of illustration, the pad 2 is shown extending above the surface 6 as a bump.

Referring next to FIG. 4, the beam lead 3 is shown connected to the pad 2. The actual connection types made in the art are by localized melting or thermocompression bonding. The connection 8 is schematically shown as having fillets.

Referring next to FIG. 5, in accordance with the invention, the beam lead 3 to pad 2 connection 8 is immobilized by providing on a localized region surrounding the pad 2 and beam lead 3 a quantity of a material 9 that has a high Young's modulus. The material 9 is shown cutaway at 12 and 13 to show the location of the connection 8 within it. The material 9 extends for a distance 14 on each side of the pad 2 about the width of the beam lead 3, extending under and above the beam lead 3, but ending before the edge of the chip and not extending over the broad surface area of the chip. Under those conditions, the connection is fully immobilized yet residual stresses on the chip surface are avoided. Where the pads are in line at the edge of the chip, the material 9 can be an annulus.

As the relative sizes and mass of the chip, the tape or other conductor support and the conductors themselves change, the forces on the connection 8 also change. In the TAB technology with sizes of the order of 1 micrometer, stresses on the beam lead 3 parallel to the length of the beam lead caused by differential expansion between the chip, the tape and the conductor are becoming a significant source of failure of the connection 8.

In FIG. 6 a schematic three-dimensional view of the invention is shown with the environmental protecting material 11 extending from the chip edge over the immobilizing material 9 and then continuing over the broad chip face illustrated as region 15. The environmental protecting material has a high TCE, compatible with the chip and further has a low Young's modulus. These conditions permit the avoidance of residual stresses at the passivation 6 material 11 interface and failures due to chip cracking and loss of adhesion.

The invention is illustrated in FIG. 7 in a three-dimensional schematic cutaway view in the TAB type technology, again using the same reference numerals. In FIG. 7, the chip 1 is positioned in an aperture 16 in a tape 17 that supports the beam leads 3, the external circuit connection ends of which are positioned on non-conducting supports 18. The tape 17 is advanced using sprocket-like mating openings 19. The pads 2 are shown in a line at the vicinity of the chip edge and the immobilizing material 9 is in the form of an annulus. It will be apparent that in chips having pad configurations that are positioned further in from the edge of the chip, discrete areas or multiple annuluses can be provided.

The immobilizing material may be any non-conducting material having a high Young's modulus. It should be sufficiently pliable in application to be able to go under the lead 3 next to the pad 2 as illustrated in FIG. 5. There are members of the class of plastic materials known as epoxy resins that provide satisfactory Young's modulus values.

The immobilizing material 9 is applied after the bonding of the leads 3 to the pads 2 coating an area 10 around the pad 2 to a narrow dimension on the surface illustrated as 14 or where the pads 2 are in a line at the edge as an annulus but not extending as far as the chip edge or over the broad chip surface. Where the material 9 is applied in an uncured state, the curing next takes place. The resulting structure immobilizes the bond 8 from stresses in all directions.

The effect of the mechanical reinforcement in immobilization may further be seen from the following relationships.

If the force, that is placed on the lead-pad interface illustrated as bond 8 because of the different expansions of the chip and the outer supporting structure of the beam lead 3 in further processing and operation in service, is assigned the symbol $F_{EXP}$, then the shear stress $\tau$ exerted by this force, that in the absence of this invention would have been concentrated on bond 8, will be as shown in Equation 2.

$$\tau = \frac{F_{EXP}}{A_{TOT}} \qquad \text{Equation 2}$$

where $A_{TOT}$ is the total effective area, which in turn is the sum of the areas of the pad 3, assigned the symbol $A_{PAD}$ and the area of contact of the material 9 with the surface of the passivation 6, assigned the symbol $A_{ENC}$.

Under these conditions, the areas relate as shown in Equation 3.

$$A_{TOT} = A_{ENC} + A_{PAD} \qquad \text{Eq. 3}$$

The total strain $\gamma$ caused by the stress $\tau$ relate as shown in Equation 4.

$$\gamma = \frac{\tau}{K_{EFF}} \qquad \text{Equation 4}$$

where $K_{EFF}$ is the effective shear modulus and is as set forth in Equation 5.

$$K_{EFF} = K_{PAD}\frac{A_{PAD}}{A_{TOT}} + K_{ENC}\frac{A_{ENC}}{A_{TOT}} \qquad \text{Equation 5}$$

where $K_{PAD}$ and $K_{ENC}$ are the shear moduli of the pad 2 and material 9, respectively, and are constants of the particular materials employed.

The combination of the equations produces Equation 6 which describes the effective shear strain.

$$\gamma = \frac{F_{EXP}}{(K_{PAD}A_{PAD} + K_{ENC}A_{ENC})} \qquad \text{Equation 6}$$

It should be noted that the term $K_{ENC}A_{ENC}$ due to the material 9 describes the immobilization effect of the material 9 and decreases shear strain on the bond 8 because of this effect. Since the total shear force $F_{EXP}$ is a fixed relationship for a given chip, lead, support combination such immobilization reduces the effective deformation as processing and service cycles occur thereby enhancing fatigue life.

The entire chip face, including over the localized area immobilizing material 9 is covered with a low Young's modulus, high TCE material 11 that provides environmental protection such as from moisture and some mechanical protection from particles and handling. Where an hermetic package is employed and no handling damage is anticipated, the material 11 could be omitted. However, the material 11 is conveniently applied shortly after the material 9 is cured and at that time frequently not all potential handling hazards or environmental considerations are fully envisioned so that the material 11 is also effective in damage prevention. The silicone type materials have the requisite characteristics to serve as the material 11.

BEST MODE OF CARRYING OUT THE INVENTION

In a preferred embodiment of the invention, the chip 1 would be one of silicon (Si) with a passivation 6 of an oxide of silicon ($SiO_x$) or gallium arsenide (GaAs) with a passivation of silicon nitride ($Si_3N_4$). The pads 2 would have an area of about 4 micrometers with a pad to pad spacing of about 2 micrometers, they would be of lead-tin (PbSn) solder with a lead-tin (PbSn) solder coating on the end to be bonded of the beam lead 5 which is about 2 micrometer wide copper (Cu) thereby permitting a fused bond 8 at a temperature less than 300° C. The immobilizing material 9 is of filled epoxy such as that available in the art under the name Dexter-Hysol 4322 having a flexural modulus of 238,000 psi and a TCE of 30 parts per million per degree C. The environmental material 11 is of silicone such as that available in the art under the name Amicon 3622 having a flexural modulus of 61 psi and a TCE of 470 parts per million per degree C.

What has been described is a high strength low stress packaging technique for beam lead semiconductor devices wherein the strain at the bond fastening the beam lead to the pad on the chip is minimized without introducing other stresses elsewhere on the chip.

Having thus described our invention, what we claim as new and desire to secure by Letters Patent is:

1. An electronic assembly comprising:
    a semiconductor device having a surface area with electrical contact locations, said semiconductor device being of a material taken from the group of Si and GaAs,
    at least one external electrical connecting member having an inner and outer end, each said inner end being bonded to a contact location on said semiconductor device,
    a quantity of epoxy immobilization material positioned exclusively in the immediate vicinity of each connecting member bond at each contact location, the remaining portion of said surface area of said device being free of epoxy and,
    a layer of silicone encapsulating material covering the entirety of said epoxy free surface area and extending over said epoxy material.

2. A semiconductor device comprising in combination:
    a semiconductor chip of material taken from the group of Si and GaAs having in a broad surface thereof at least one electrical interconnection pad,
    at least one connecting member taken from the group of beam leads and wires each said connecting member having one end thereof bonded to a pad on said chip,
    an immobilizing member of epoxy material surrounding and encapsulating said bond only in the locality of said pad in a limited contact area, the remainder of said chip surface, being free of epoxy and,
    a layer of silicone environmental protecting encapsulant covering the entirety of said epoxy free chip surface and extending over said immobilizing member.

3. In a semiconductor integrated circuit assembly of the type having connection members extending from a support to pads on the surface of a semiconductor chip to which pads said connection members are bonded, the improvement comprising:
    a quantity of epoxy immobilizing material surrounding and encapsulating each said pad to connection member bond only in a locality of said pad, the remaining area of said surface of said chip being free of said immobilizing material, and, silicone environmental protecting means encapsulating at least the entirety of said immobilizing material free surface of said chip.

4. The semiconductor integrated circuit assembly of claim 3 wherein said pads on said chip are in a line near at least one edge of said chip and said quantity of immobilizing material contacts said chip only in the line of said pads the remainder of said chip being free of said immobilizing material.

5. Semiconductor electronic apparatus comprising in combination:
    a semiconductor element having a surface area with electrical contact locations,
    at least one external electrical connecting member having an inner and an outer end, each said inner end being bonded to a contact location on said semiconductor element,
    a quantity of an epoxy immobilizing material positioned exclusively in the immediate vicinity of each connecting member bond at each contact location, the remaining portion of said surface area being free of said immobilizing material, and,
    a layer of silicone encapsulating material covering the entirety of the portion of said surface area that is free of said immobilizing material and extending over said immobilizing material.

* * * * *